United States Patent [19]

See et al.

[11] Patent Number: 5,987,478

[45] Date of Patent: *Nov. 16, 1999

[54] VIRTUAL SMALL BLOCK FILE MANAGER FOR FLASH MEMORY ARRAY

[75] Inventors: Deborah See, Placerville; Rina Martin, Roseville, both of Calif.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/550,979

[22] Filed: Oct. 31, 1995

[51] Int. Cl.⁶ ........................................ G06F 17/30
[52] U.S. Cl. .................... 707/205; 707/200; 711/103; 711/202
[58] Field of Search ..................... 395/611, 402, 395/620, 443; 707/200, 205; 711/103, 202

[56] References Cited

U.S. PATENT DOCUMENTS

| | | | |
|---|---|---|---|
| 4,958,315 | 9/1990 | Balch | 364/900 |
| 5,119,291 | 6/1992 | Flannagan et al. | 395/275 |
| 5,247,658 | 9/1993 | Barrett et al. | 395/600 |
| 5,317,535 | 5/1994 | Tareja et al. | 365/185 |
| 5,337,275 | 8/1994 | Garner | 365/189.01 |
| 5,341,339 | 8/1994 | Wells | 365/218 |
| 5,357,475 | 10/1994 | Hasbun et al. | 707/202 |
| 5,404,485 | 4/1995 | Ban | 711/20 G |
| 5,438,573 | 8/1995 | Mangan et al. | 371/10.3 |
| 5,438,773 | 8/1995 | Mangan et al. | 371/10.3 |
| 5,444,656 | 8/1995 | Bauer et al. | 365/189.01 |
| 5,457,658 | 10/1995 | Niijima et al. | 365/218 |
| 5,471,478 | 11/1995 | Mangan et al. | 371/10.3 |
| 5,485,595 | 1/1996 | Assar et al | 711/103 |
| 5,524,230 | 6/1996 | Sakaue | 711/103 |
| 5,544,119 | 8/1996 | Wells et al. | 365/185.11 |
| 5,544,356 | 8/1996 | Robinson et al. | 707/205 |
| 5,559,956 | 9/1996 | Sukegawa | 395/182.06 |
| 5,563,828 | 10/1996 | Hasbun et al. | 365/185.33 |
| 5,568,634 | 10/1996 | Gordons | 711/170 |
| 5,581,723 | 12/1996 | Hasbun et al. | 711/103 |
| 5,592,669 | 1/1997 | Robinson et al. | 395/622 |
| 5,598,370 | 1/1997 | Niijima et al. | 365/185.33 |
| 5,611,067 | 3/1997 | Okamoto et al. | 395/430 |
| 5,630,093 | 5/1997 | Holzhammer et al. | 395/442 |
| 5,640,529 | 6/1997 | Hasbun et al. | 395/430 |
| 5,740,396 | 4/1998 | Mason | 711/103 |

FOREIGN PATENT DOCUMENTS

| | | |
|---|---|---|
| 175458 | 3/1986 | European Pat. Off. . |
| 392895 | 10/1990 | European Pat. Off. . |

OTHER PUBLICATIONS

Michael C. Markowitz, "Nonvolatile Memories, " EDN, vol.34, No. 18, pp. 94–104, Sep. 1989.

K Robinson, "Trends in Falsh Memory System Design," Wescon Conference, Record 34,34, pp. 468–472, Nov. 1990.

M, Levy, "Fash Memory Operates, " times longer, computer technology review, Aug. 1990.

*Primary Examiner*—Paul R. Lintz
*Assistant Examiner*—Jean M. Corrielus
*Attorney, Agent, or Firm*—Blakely, Sokoloff, Taylor & Zafman

[57] ABSTRACT

A file system created in a flash EEPROM memory array including a first data structure for file entries, the file entries being arranged serially for access, each file entry pointing to one of a plurality of second data structures; a plurality of second data structures for file information entries, each file information entry of the second data structure pointing to data in one file, each file information entry of the second data structure being arranged serially for access and pointing to data entered in a file; and a plurality of data entries each pointed to by a file information entry of one of the second data structures.

26 Claims, 9 Drawing Sheets

VIRTUAL SMALL BLOCK FILE MANAGER FOR FLASH MEMORY ARRAY

BACKGROUND OF THE INVENTION

1. Field Of The Invention

This invention relates to electronic storage systems utilizing flash EEPROM memory and, more particularly, to methods and apparatus for managing files in flash EEPROM systems in order to conserve power.

2. History Of The Prior Art

Recently, flash EEPROM storage devices have been used in arrays as a new form of memory array. A flash EEPROM memory array is constructed of a large plurality of floating-gate metal-oxide-silicon field effect transistor devices arranged as memory cells in typical row and column fashion with circuitry for accessing individual cells and placing the memory transistors of those cells in different memory conditions. Such memory transistors may be programmed by storing a charge on the floating gate. This charge remains when power is removed from the array. This charge (typically called a "zero" or programmed condition) or its absence (a "one" or erased condition) may be detected when the device is read.

These flash memory arrays may be designed to accomplish many of the operations previously accomplished by other forms of memory in digital systems and especially in computer and control systems. For example, flash memory is being used to replace various read-only memories such as the basic input/output startup (BIOS) memory of a computer system. The ability to program flash memory in place offers substantial advantages for BIOS and similar read only memories over more conventional EPROM memory. Because of this ability, its great insensitivity to mechanical shock, and its very high reliability, flash memory is also being used in embedded systems to store data generated by operations of associated systems. More recently, flash memory has been used to provide a smaller lighter functional equivalent of an electro-mechanical hard disk drive. Flash memory is useful for this purpose because it may be read more rapidly and is not as sensitive to physical damage as an electro-mechanical hard disk drive. Flash drive memories are especially useful in portable devices where space is at a premium and weight is extremely important.

In general, a flash EEPROM memory array is divided into blocks which are connected so that each entire block of memory cells may be erased simultaneously. An erasure places all of the memory cells in the block into the erased condition. Thereafter, a memory cell may be individually programmed to store data. Since all of the memory transistors of a block of the array are joined so that they may be erased together, a cell in a programmed condition cannot be switched to the erased state until the entire block of the array is erased. Contrasted to other memories in which changed data is written, essentially instantaneously, directly in place of the data it replaces, a flash EEPROM memory array requires a time consuming erasure process. Because flash memory is erased in blocks, out-of-date information cannot be erased without erasing all of the valid information that remains in the block along with the invalid information. Consequently, when the information at a data entry changes in flash memory used to store changing information, the new information is written to a new memory area rather than written over the old data; and the old data is marked as invalid. Then, after a block has filled and a sufficient portion of a block has been marked invalid, all valid information remaining in the block is written to the new memory area; and the entire block may then be erased, typically using a background process.

Since the processes by which data is written to and erased from a flash memory array are quite complicated, these processes require significant periods and a great deal of power to accomplish. Embedded systems which utilize flash memory arrays typically are portable and have limited power storage capability. For this reason, reducing the power requirements of various operations as much as possible in embedded systems is very desirable.

One operation which must be conducted by an embedded system using a flash memory array is the management of the data stored in that array. Heretofore, flash memory systems have utilized managers which keep track of files by linked lists generally referred to as file allocation tables. The MS DOS operating system is probably the best known system which uses this sort of a manager. In such a system, the data in a file is stored in physical sections called sectors which are all of the same size. In the file allocation table, a pointer including the length of the data entry is provided to the start of any escort of the file at which that portion of the file commences. Whenever the filing of data in sequential sectors ends and new data is stored in a discontinuous sector, a new pointer is added to the file allocation table to point to the new data. Sectors provide an especially convenient way to store files in a rotating disk drive. In addition to a pointer to the actual data, each file allocation table entry stores a pointer to the next file allocation table entry in sequence which points to a part of the file.

One problem with such linked lists is that if the pointer is somehow rendered incorrect at any point in the file, the remainder of the file is lost and requires significant expertise to recover. A more important problem, particularly with embedded systems, is that each time a data file is changed in a manner which adds data to or removes data from the file, the file allocation table for that data file and the data file itself must be rewritten from the point of the change. The operations necessary to erase and rewrite the file allocation tables and files in flash memory are not only time consuming but require a significant amount of power and reduce the time a system can operate without recharging the power source.

It is desirable to provide a new file manager for an embedded flash EEPROM file management system which significantly reduces the power usage and the storage overhead of such a system.

SUMMARY OF THE INVENTION

It is, therefore, an object of the present invention to provide an improved file manager for flash memory arrays capable of reducing the use of power by such arrays while requiring less memory than typical file managers.

This and other objects of the present invention are realized by a file system created in a flash EEPROM memory array including a first data structure for file entries, the file entries being arranged serially for access, each file entry pointing to one of a plurality of second data structures; a plurality of second data structures for file information entries, each file information entry of a second data structure pointing to data in one file, each file information entry of a second data structure being arranged serially for access and pointing to data entered in a file; and a plurality of data entries each pointed to by a file information entry of one of the second data structures.

These and other objects and features of the invention will be better understood by reference to the detailed description

Notation And Nomenclature

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
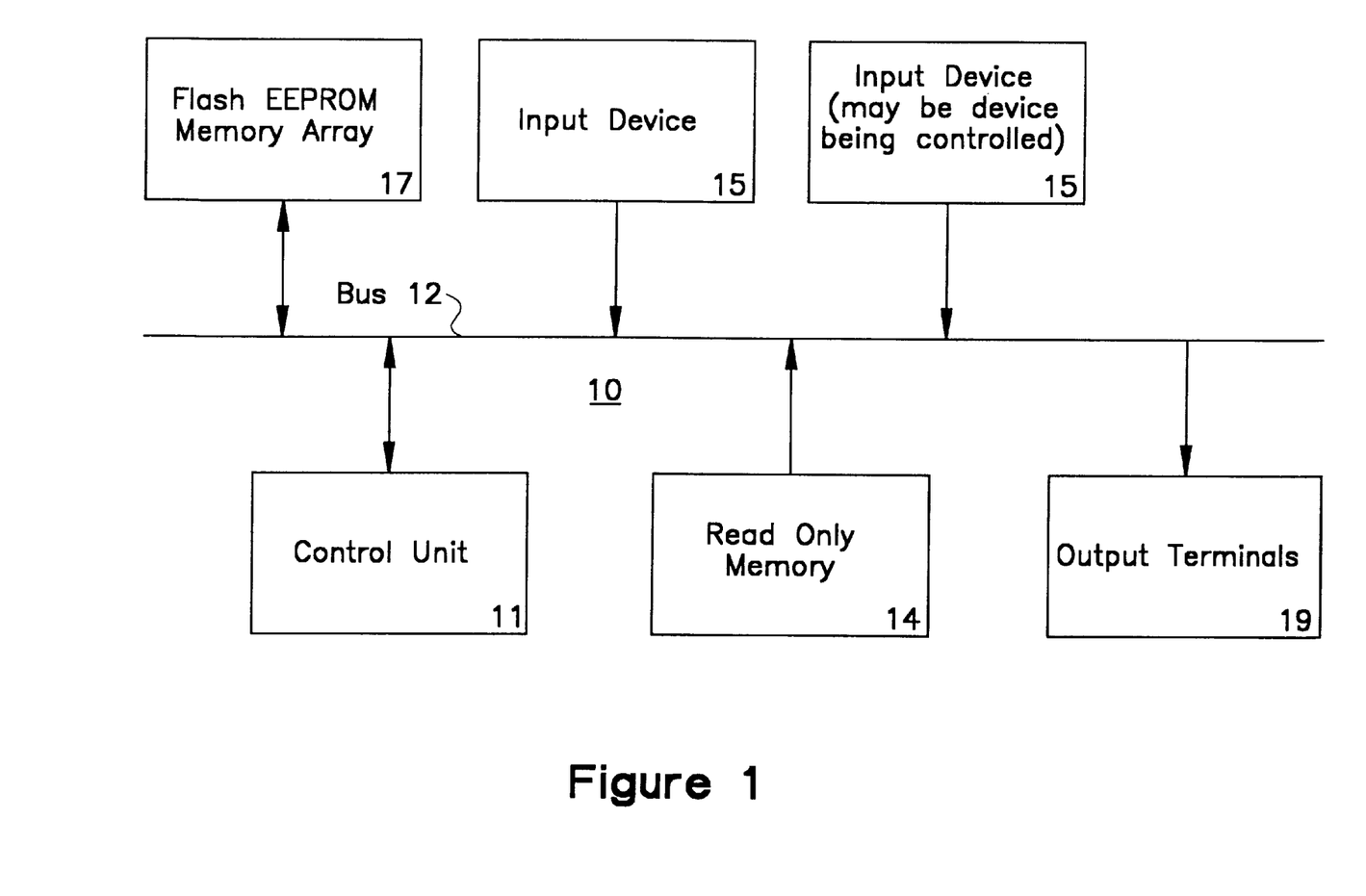
FIG. 1 is a block diagram of an embedded system designed in accordance with the present invention.

Referring now to FIG. 1, there is illustrated an embedded control system 10 configured in accordance with one embodiment of the present invention. The system 10 illustrated includes a control unit (controller) 11 which executes the various instructions provided to control the operations of the system 10. In particular systems, the control unit 11 may be an actual controller which is capable of only the limited operations necessary to carry out its limited functions; in other systems, the control unit 11 may be a microprocessor capable of general purpose use. Where the control unit 11 is a microprocessor, it is typically joined through a bus 12 to a read only memory (ROM) circuit 14 which provides the processes for controlling the operations conducted by the control unit 11. The memory circuit 14 may be an EPROM memory array, a flash EEPROM memory array, or another type of memory array used to provide control processes in the prior art. In a typical system 10 using a microprocessor, various input devices 15 are connected to the bus 12 to furnish data which the control unit 11 may write to a flash EEPROM memory array 17. A number of output terminals 19 may be provided. In a system 10 using a controller, the data input devices 15, the memory circuit 14, the flash memory array 17, and any associated components may be connected to the controller directly through individual interfaces rather than a bus.

In some typical embedded systems, data is provided to the control unit 11 at the input devices 15 by an associated system being monitored and is stored in the flash EEPROM memory array 17. As the data is accumulated, processes are run which cause the control unit 11 to utilize that data to produce output signals for varying the operation of the associated system. In general, an embedded system provides only sufficient functional components and operating processes to carry out the purposes for which the control system is designed. Where the purpose of the system is to store data generated by some associated system and manipulate that data to provide specific outputs, the primary components and processes needed in the system 10 are ones sufficient to accomplish the writing of the data provided by the associated system and to manipulate that data in the prescribed manner. Since the system 10 need accomplish only a few primary tasks, the overhead required has typically been kept low so that the amount of the flash memory actually used for storage may be kept as large as possible.

In order to utilize flash memory, there must be flash management processes to track the positioning of data making up each file stored, to write the data as it is gathered and the results as the data is manipulated, to modify the data as new data is gathered, to read the data stored, and to erase the data when the data stored has become invalid. Typically, these processes utilize a significant amount of the data space provided by the flash memory array.

Flash memory arrays are typically purchased and placed in an embedded system by the system manufacturer. The manufacturer may design its own file management system, a difficult programming operation, or port a known system to the array. Probably the best known file management system for Intel-processor-based systems is the MS DOS file allocation table (FAT) system. Unfortunately, this file management software requires a great deal of the flash memory and is quite difficult to port. In a typical flash memory array used in embedded systems, the MS DOS file allocation table system requires too much of the flash storage space and provides too many unnecessary functions. Moreover, each time a data file is changed in a manner which adds data to or removes data from any portion of the file except at the end, the MS DOS file allocation table for that data file and the data in the file from the point of the change must be rewritten. The operations necessary to erase and rewrite the file allocation tables and data in flash memory are not only time consuming but require a significant amount of power and reduce the time a system can operate without recharging. This has substantially limited the use of flash memory arrays in smaller, less complicated embedded systems.

Figure 2:
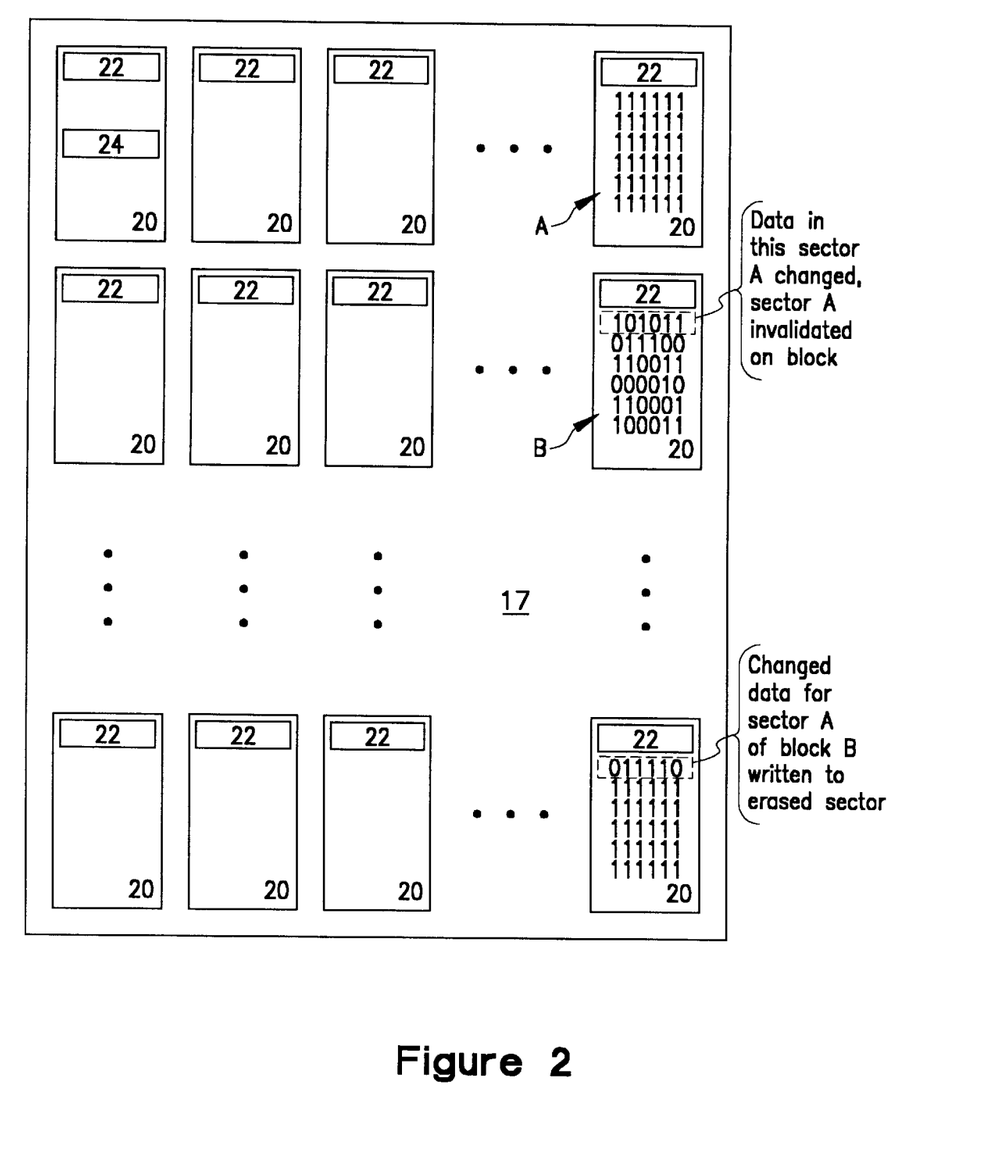
FIG. 2 is a block diagram of a flash memory array designed in accordance with the present invention for use in the system of FIG. 1.

FIG. 2 is a block diagram of a flash EEPROM memory module 17 which 5 may be used in embedded systems such as that generally described in FIG. 1. The module 17 is divided into a number of blocks 20 each of which may be independently erased. Each of these blocks 20 includes flash memory cells joined in logical row and column arrangement. Any particular cell is accessed by selecting its row and column in the manner in which data is accessed in dynamic random access memory (DRAM).

In contrast to DRAM, however, flash disk memory is typically provided signals which indicate a position at which the data is to be stored in logical terms which relate to rotating devices since flash disk memory essentially replaces such rotating devices. For example, data is furnished with a logical identifier and is typically stored in each of the blocks 20 of the module 17 in the sectors typically associated with electromechanical hard disk drives used in the system. (Sectors are storage divisions which are all of the same size, a size which may vary over a wide range). For this reason, the control unit 11 and the read only memory 14 must together provide control processes for translating the logical identifier furnished to physical addresses used in a row and column array for storing that data. In addition, the control unit 11 and the read only memory 14 must together provide control processes for allocating particular portions of the array to particular files and tracking those files as they change so that all parts of a file may be recovered. To accomplish this, the control processes cause one or more file allocation data structures 24 to be stored in the module 17. Such data structures provide the information necessary to determine the physical positions of the data on the blocks of the array. Such file allocation data structures are typically stored in a single block 20 of the array.

In flash memory arrays, when data is first written to an array, that data is typically written to an empty (erased) block (see block 20A) on a sector by sector basis. As the data is written, the file allocation data structure for the file being written is constructed. Using prior art techniques, this typically requires that as a first sector for a file is written, a first element of the file allocation data structure is generated which includes the file identification and a pointer to the physical sector. When the file being written requires more than one sector, another element of the file allocation data structure is created with a pointer to the new physical sector. At the same time, a pointer to that new element of the file allocation data structure is placed in the preceding element. Each time a new sector is used for writing the file, another element of the file allocation data structure is generated and linked to the preceding element. When the file has been written, an end of file marker is placed in the last element of the file allocation data structure. This allows the entire file to be recovered by the file management process starting at the first element and running through the linked elements to the end to determine the address of each physical sector including data.

However, the manner in which flash memory is managed makes a file allocation table of this type very costly in terms of power used. For example, when one block of a flash memory array has been filled (see block 20B), the writing of more data continues on a next empty block for the initial and any addition files. When data at a particular sector on a block is changed and must be rewritten, the data already stored at that sector (see sector A in block 20B) cannot be erased unless all of the data on the block is erased. Consequently, the changed data is written to an empty sector on a block (see block 20C) which has not yet been filled.

When data is changed and written to a different sector, the file allocation data structure and the file containing the data must be changed beginning at the point at which the change in the file occurs. In order to change the file and the file allocation data structure in a flash array, each must be rewritten to an entirely new sector. The file must be rewritten in its entirety beginning at the sector at which the change occurs, while the file allocation data structure must be rewritten beginning at the element which includes a pointer to the first new entry of the file allocation data structure. As will be understood from continuing through this description, changing the data in the file and the file allocation table is not a simple task. It is also a task which requires a great deal of power since it must occur with prior art file management processes each time any file changes in any way.

Since new data cannot simply be written over old data in a flash array, the blocks of the flash array will gradually fill. To keep the array from filling, the media manager typically carries on a continuing background process by which the block having the smallest number of valid sectors is erased. This process includes writing all valid sectors on the block to empty space on a block which has not yet been filled, updating the data structures created for accessing the blocks, marking all of the sectors on the old block invalid, and finally erasing the old block so that it may be put back into use as an empty block.

As is known to those skilled in the art, flash memory arrays are not written in the same manner as DRAM or other memory. When DRAM or a form of magnetic memory is written, the states of all of the bits being written change essentially together. When a word or byte of flash memory is written, the current requirements to charge the floating gates are much higher, so the devices are often pulsed over and over until they arrive at the proper charge condition. Similarly, it takes much more current to discharge the floating gates of the flash devices because the charge is greater and because the erase process necessary before writing first places all flash devices in the charged state and then discharges all of the devices by application of large potential differences. All of these power consuming operations must be taking place constantly because of the need to constantly rewrite each file which changes in the flash array and its file allocation data structure.

Figure 3:
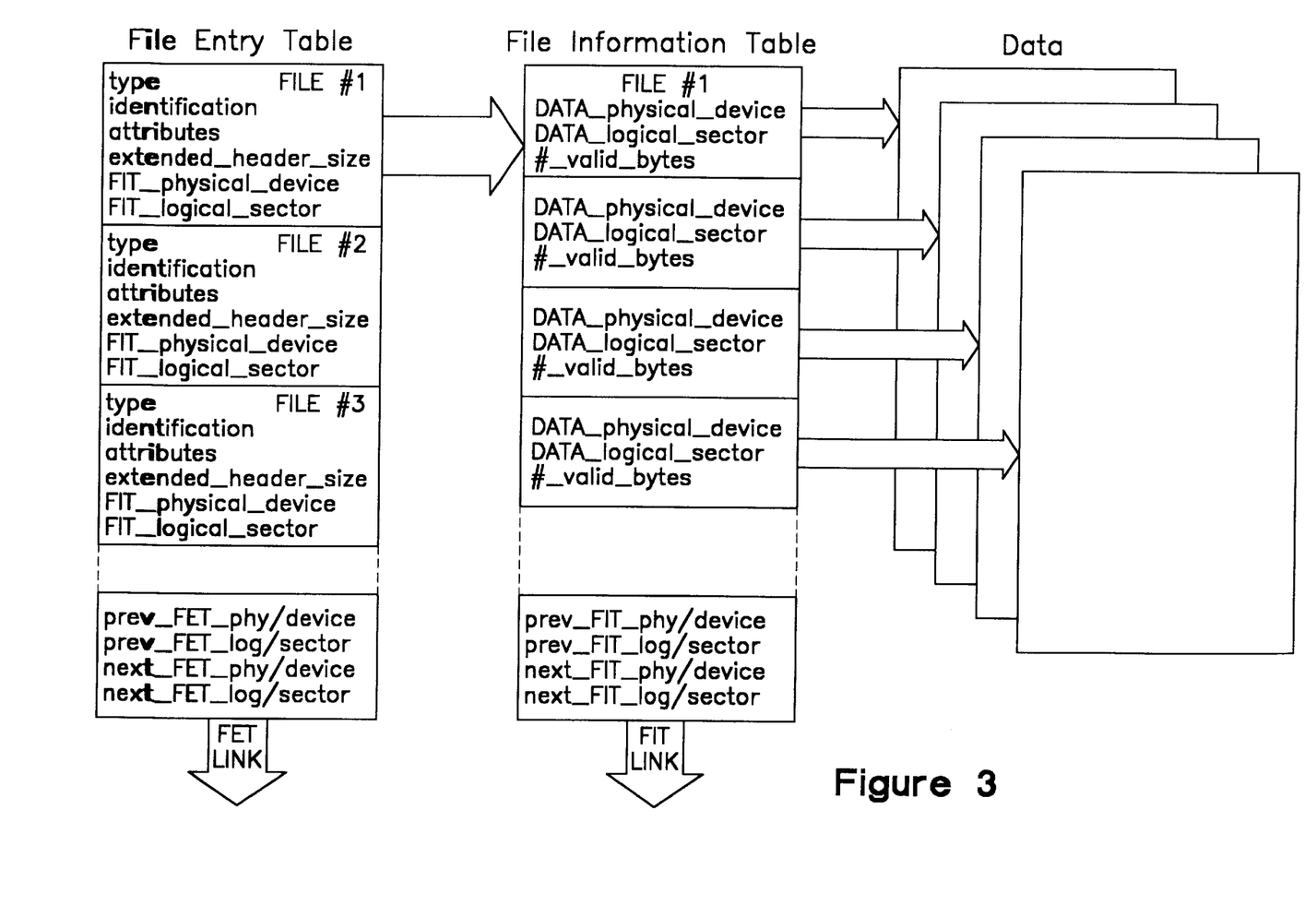
FIG. 3 is a diagram illustrating the overall structure for accomplishing storage of data in a flash memory array designed in accordance with the present invention.

The present invention provides a new file manager which substantially reduces the write and attendant erase operations required in order to keep track of changes in files. FIG. 3 is a block diagram illustrating an outline of the structure of the file system created using this new file manager. This structure is typically created in the flash EEPROM memory the files of which are being managed. When a first file (FILE #1 in the figure) is being created, the file manager begins the construction of a file entry table (FET) in one sector of one of the blocks of the array by writing a file entry for the first file in the table. The file entry table is a data structure which includes a file entry for each file stored in the flash memory array. The file entry table initially uses only one sector. In this sector, file entries for each file are arranged serially as each new file is opened and include the initial data necessary to manage the file. In one typical embodiment (other embodiments may use different values), a file entry uses eighteen bytes of 512 bytes allotted to a sector so that a large number of files may be stored before the space in a sector is filled. If more space is necessary for file entries after the last file entry has been written, the file manager writes an entry linking the sector of the file entry table which has filled to a new file entry table sector which will be added to provide additional space for the file entry table. Since the only linking entries are those joining a FET sector to another FET sector, most entries in the FET are simply accessed sequentially within a sector and require no linking. Consequently, the chance of data loss due to a linking error is drastically reduced.

In one embodiment, each file entry includes a number of bits sufficient to indicate a file type, a file identification, file attributes, an extended header entry, a physical device identifier for a file information table (FIT), and a logical identifier for the file information table. The file type may be used to identify any desirable features of a file, e.g., whether the file is binary or ASCII; in one embodiment two bytes are provided for file type. The file identifier is typically only a small number rather than a name since long names are not really necessary for the small number of files typically used in such an embedded system; in one embodiment the file identification requires four bytes. File attributes may include indications such as the validity of the data in the file; in one embodiment two bytes are provided for attributes. An extended header entry (which may be of any size but is four bytes in one embodiment) allows a header to be stored with the actual file to include additional information such as date, time, and the like if these are desired. The physical device identifier (two bytes in one embodiment) identifies the physical component which includes the flash memory block in which the file information table for the file is stored. The logical identifier identifies the logical sector of the file information table (two bytes in one embodiment) and is used by the flash media manager to determine the physical address of the file information table within the array using a logical/physical translation table kept by the flash media manager in the array.

The entry linking the sector of the file entry table which has filled to a new file entry table sector includes, in one embodiment, a number of bytes (eight bytes in one embodiment) sufficient to indicate physical device identifiers for the sector previous to the sector which has filled and the new file entry table sector, and logical sector identifiers for the previous and new sectors storing the file entry table. This provides a double link to both the sector preceding and the sector following so that if a linking entry has an error, the files may still be recovered. Each physical device identifier identifies the physical component which includes the flash memory block in which the particular sector for the file entry table is stored. Each logical sector identifier is used by the flash media manager to determine the physical address of the particular file entry table sector within the array using the logical/physical translation table kept by the flash media manager in the array.

As may be seen from the data, the information included in each file entry will remain constant throughout the life of the file. Consequently, the individual file entries do not change during the life of any of the files except for a change in attributes when a file is deleted. An indication that a file has been deleted may be written to a single bit position by programming a single bit from the erased to the programmed condition. In one embodiment, two bits are programmed, a first when the deletion process begins and the second when the process ends. Since programming a bit in a predetermined position known to be in the erased condition does not require that the block be erased, there is never a need to rewrite the file entry table simply because a file in the file entry table is modified. A block containing a sector storing a portion of the file entry table might be rewritten to an empty block and then erased because the block had become full of invalid data, but this would typically occur relatively infrequently compared to the constant rewriting necessary with prior art file allocation tables.

Figure 4:
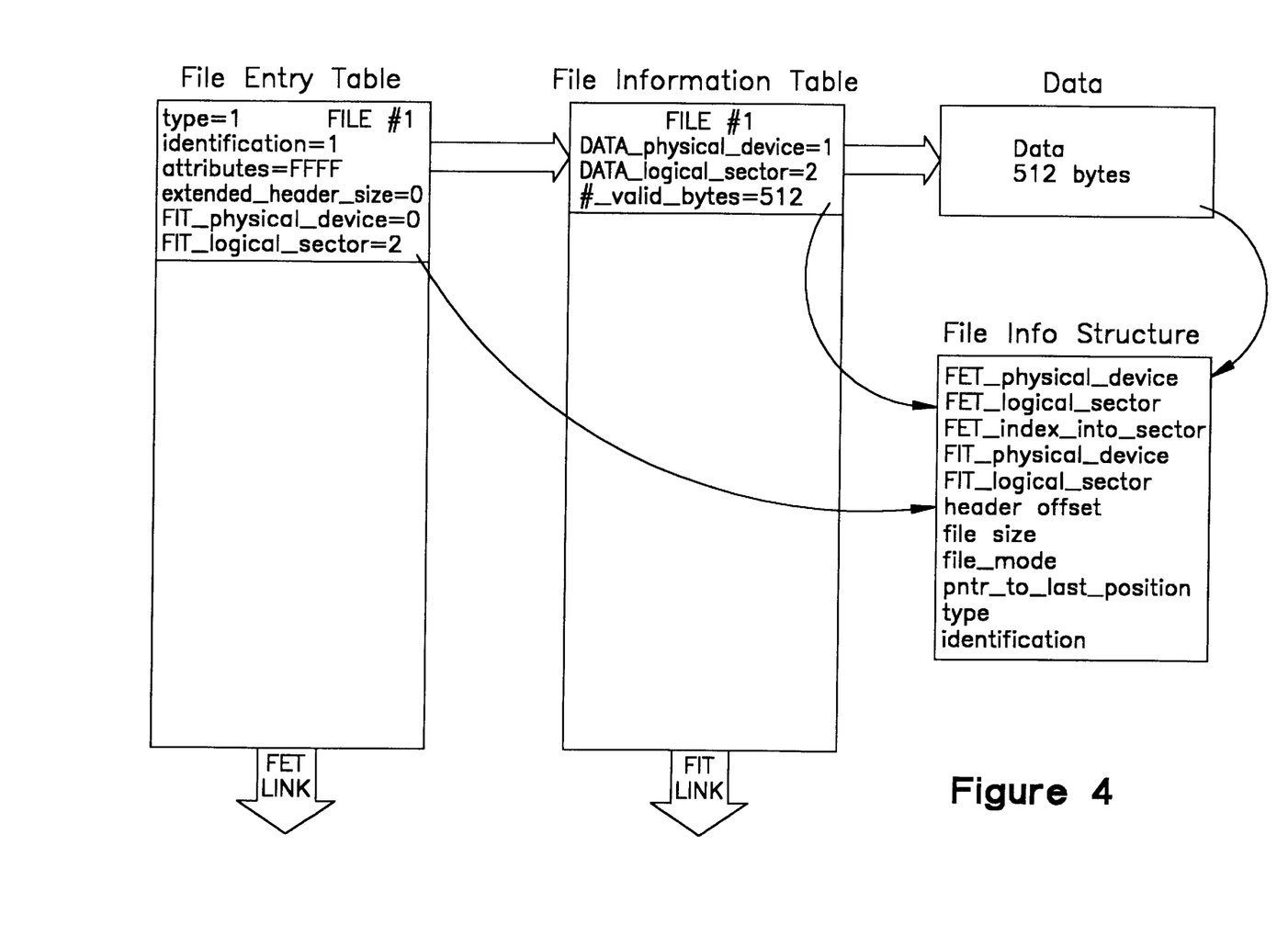
FIG. 4 is a diagram which illustrates elements of a single file which has been created and associated data structures.

In addition to creating a file entry for a file in the file entry table, the file manager begins the construction of a file information table in the sector of one of the blocks of the array data described by the physical device identifier for the file information table and its logical sector identifier located in the file entry for that file (see FIGS. 3 and 4). This is accomplished by writing a file information entry for that file in the file information table. The file information table for each file includes a file information entry for each individual portion of a file stored in the flash memory array. The file information table initially uses only one sector (FIG. 4). In this sector, the individual file information entries for each individual piece of data are arranged serially as each new change to the file occurs. Each file information entry includes the data necessary to manage the particular data stored in the file by that entry to the file. In one embodiment, a file information entry uses six bytes of 512 bytes allotted to the sector so that a large number of changes to the particular file may be stored before the space in the initial sector of the file information table is filled. If more space is necessary for file information entries, the file manager writes an entry linking the previous sector to a new sector which will be added to provide additional space after the last file information entry has been written.

In one embodiment, each file information entry includes a number of bits sufficient to indicate a physical device identifier for data stored during that entry to the file, a logical sector identifier of the data, and the number of valid bytes of data. The physical device identifier identifies the physical component which includes the flash memory block in which the data for the particular portion of the file is stored. The logical sector identifier of the data is used by the flash file manager to determine the physical address of the data within the array using the logical/physical translation table kept by the flash file manager in the array.

The entry linking the sector of the file information table which has filled to the next sector storing the file information table for the particular file includes, in one embodiment, a number of bits sufficient to indicate physical device identifiers for the physical device holding the file information table previous to the physical device holding the file information table sector which has filled (if any) and the new sector. In this embodiment, the entry also includes logical sector identifiers for the previous and new sectors storing the file information table. Each physical device identifier identifies the physical component which includes the flash memory block in which the particular sector for the file information table is stored. Each logical sector identifier is used by the flash media manager to determine the physical address of the particular file information table sector within the array using the logical/physical translation table kept by the flash media manager.

In addition to creating a file entry in the file entry table and a file information entry in the file information table for a file, the file manager writes the file data to a block of the array beginning at a sector indicated by the physical device identifier and the logical sector identifier of the data stored in the file information entry. The write begins at the address indicated and continues for the number of bytes indicated in the file information entry. If the file entry table indicates that an extended header is to be included with the file, data space for that header is provided at the beginning of the data in one embodiment. FIG. 4 is a diagram which illustrates a file which has been created and which uses 512 bytes, an entire sector, for data.

Once the file has been stored in the flash memory array, the file may be opened for reading by the file manager searching the file entry table for the file identification, reading the physical device identifier and the logical sector identifier of the file information entry, accessing the file information entry on the physical device named at the physical address, reading the data in the first file information entry for the file, and accessing the data at the physical device identifier and the physical address for the amount of data indicated by the file information entry.

The file manager continues accessing the remainder of the file information entries in the file information table and the associated data stored at different parts of the array until all changes which have been made to the file are detected and the data read.

In one embodiment of the invention, the time required to search the file entry table for the address of the file information entry and the file information entry for the data address and length is reduced through a structure called a file information structure (see FIG. 4) created in local random access memory. A file information structure is set up when the data file is opened. This structure is updated for each change to the data file. The file information structure includes a physical device identifier, a logical sector identifier, and an index into the sector for the file entry table. The file information structure also includes a physical device identifier and a logical sector identifier for the file information table for that particular file. In addition, the file information structure includes various information regarding the various portions of the data file itself including, among other things, the file identification, type, file size, file mode (e.g., read/write), a pointer to the end position in the file of the last operation performed, and an offset indicating the length of any extended header. This file information structure is searched to speed up read operations. Thus, the file information structure acts as an address cache for the file change. When the file is closed, the file information structure is invalidated.

Figure 5:
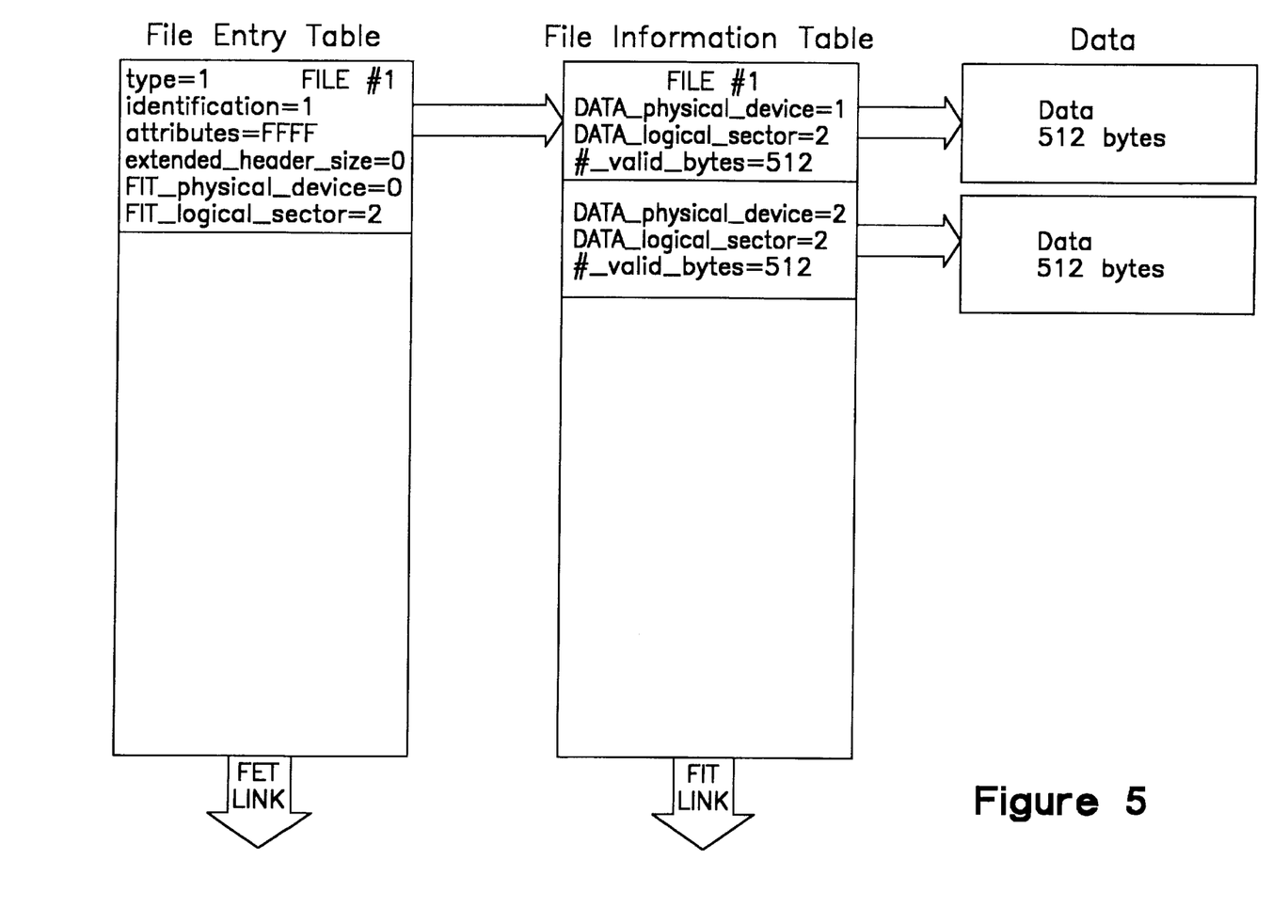
FIG. 5 is a diagram illustrating the arrangement of the various data structures and data in the flash array after data has been written to a file and then additional data has been appended to the file.
Figure 6:
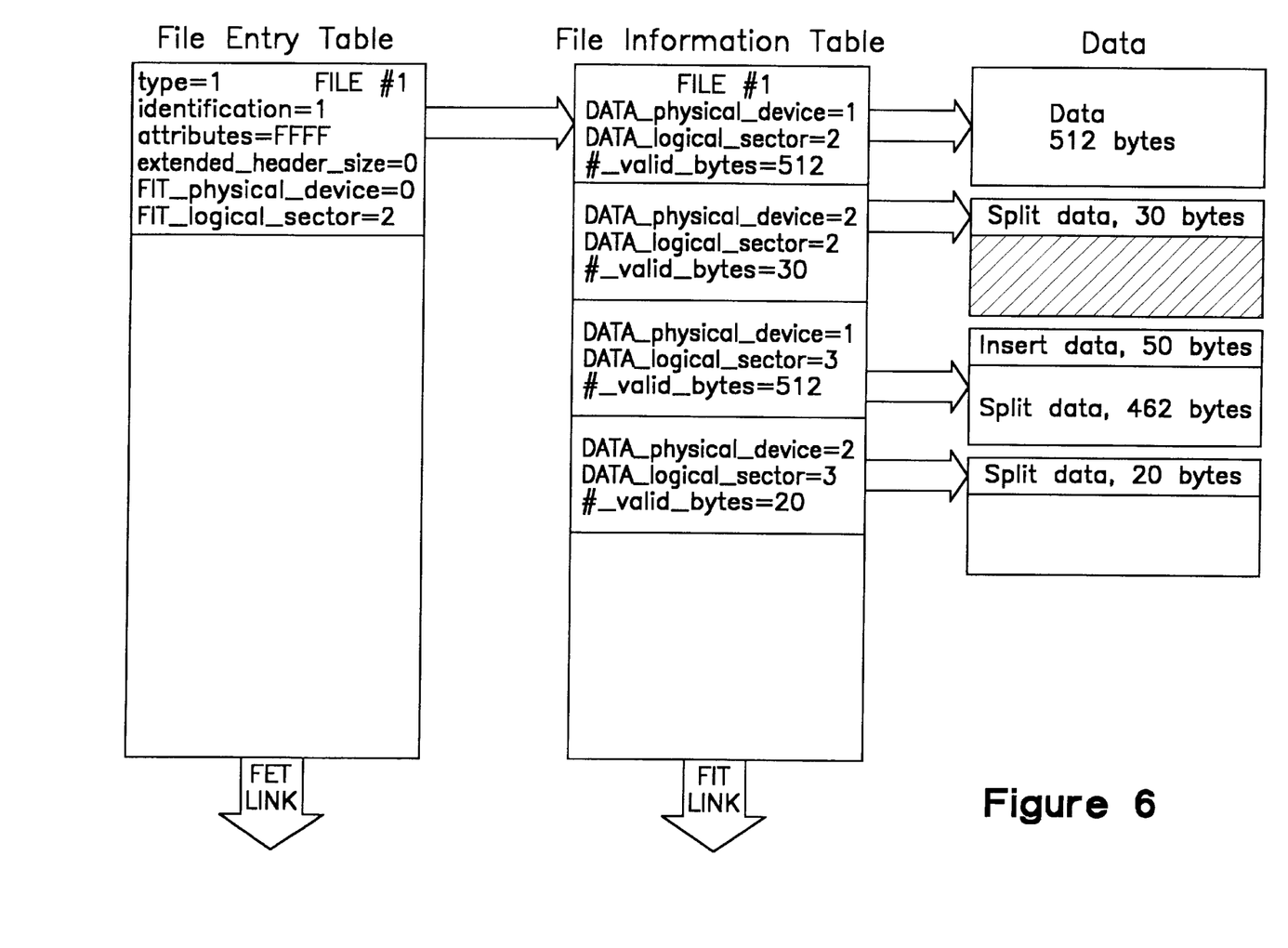
FIG. 6 is a diagram illustrating the arrangement of the various data structures and data in the flash array when the data arrangement described in FIG. 5 is modified by inserting data into a file.

When data is appended to a file which is initially in the condition illustrated in FIG. 4, the file is opened in the manner described. Then a new file information entry is created after the last file information entry in the file information table for the new data. FIG. 5 is a diagram illustrating the arrangement of the various data structures and data in the flash array after data has been written to a file and then additional data has been appended. As may be seen, a single file entry points to the logical sector at which the file information table for that file exists. Two file information entries exist in the file information table. The first file information entry points to the logical sector of the initial data entry and lists the number of bytes in the entry as 512. Similarly, the second file information entry points to the logical sector of the second data entry and lists the number of bytes in the entry as 512. This file information entry includes the same categories of information as the preceding file information entries for the file change which accomplishes the appending of new data. The appended data is then stored at the address indicated in the new file information entry. It should be noted that the data may and probably will be placed on a block of the array separate from the block on which the original file data was stored unless no other operations affecting files have occurred since the original data was filed; for example, in FIG. 5, the second file information entry points to a physical device 2 while the first file information entry points to a physical device 1. Similarly, the file entries for files added after the initial file entry table sector has filled and the file information entries for file changes occurring after the initial file information table sector has filled probably will be placed on blocks of the array separate from the blocks on which the initial file entries and the initial file information tables were stored unless no other operations affecting files have occurred since the original entries were made. FIG. 6 is a diagram illustrating the arrangement of the various data structures and data in the flash array when the data arrangement described in FIG. 5 is modified by inserting fifty bytes of data into the file at a point included in the data described by the second file information entry. More particularly, an insert of fifty bytes of data is placed in the file at a position 542 bytes from the beginning of the file. The point at which the insert is made is determined by the file manager adding the numbers of valid bytes in each file information entry until a number greater than the insert point is reached. In the example, the insert appears thirty bytes from the beginning of the data pointed to by the second file information entry. Since the inserted data cannot be written over the data in the flash block to which the file information entry points, the inserted data must be written to a new empty sector. In order to make sure the data appears in the correct order, however, the data remaining after the insert which is pointed to by the second file information entry must be placed after the insert in the file information table. To accomplish this, a new file information entry is created to replace the second file information entry and point to the data previously pointed to by the second file information entry and to provide the correct number of bytes (thirty) in the sector. This requires that all of the file information entries following that particular sector of the file information table be rewritten. The new second file information entry essentially deletes the data following the first thirty bytes pointed to by the new second file information entry.

Then the data to be inserted is written to a new empty sector. which is pointed to by a newly written third file information entry. Then the data following the first thirty bytes pointed to by the original second file information entry (which was read earlier) is written to the remaining space in the sector to which the insert has been written. Since there is insufficient data space in the sector pointed to by the third file information entry, a new fourth file information entry is written; and the overflow data is written to the data sector pointed to by that fourth file information entry. The third file information entry is marked to indicate that it includes 512 bytes, and the fourth file information entry is marked to indicate that it includes twenty bytes.

Figure 8A:
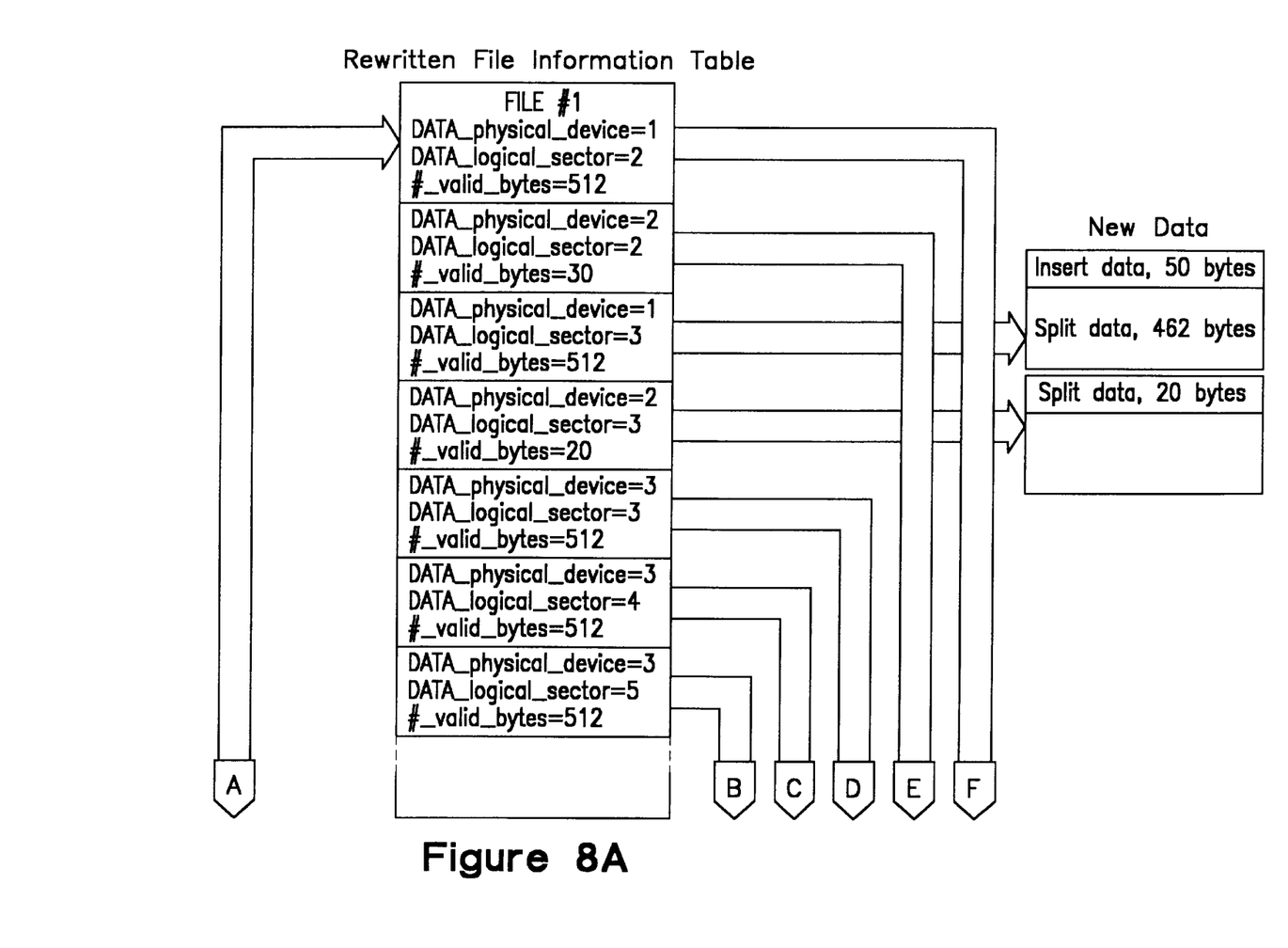
FIG. 8 is a diagram illustrating the arrangement of the various data structures and data in the flash array when a data arrangement including a large amount of data is modified by inserting data into a file.
Figure 8B:
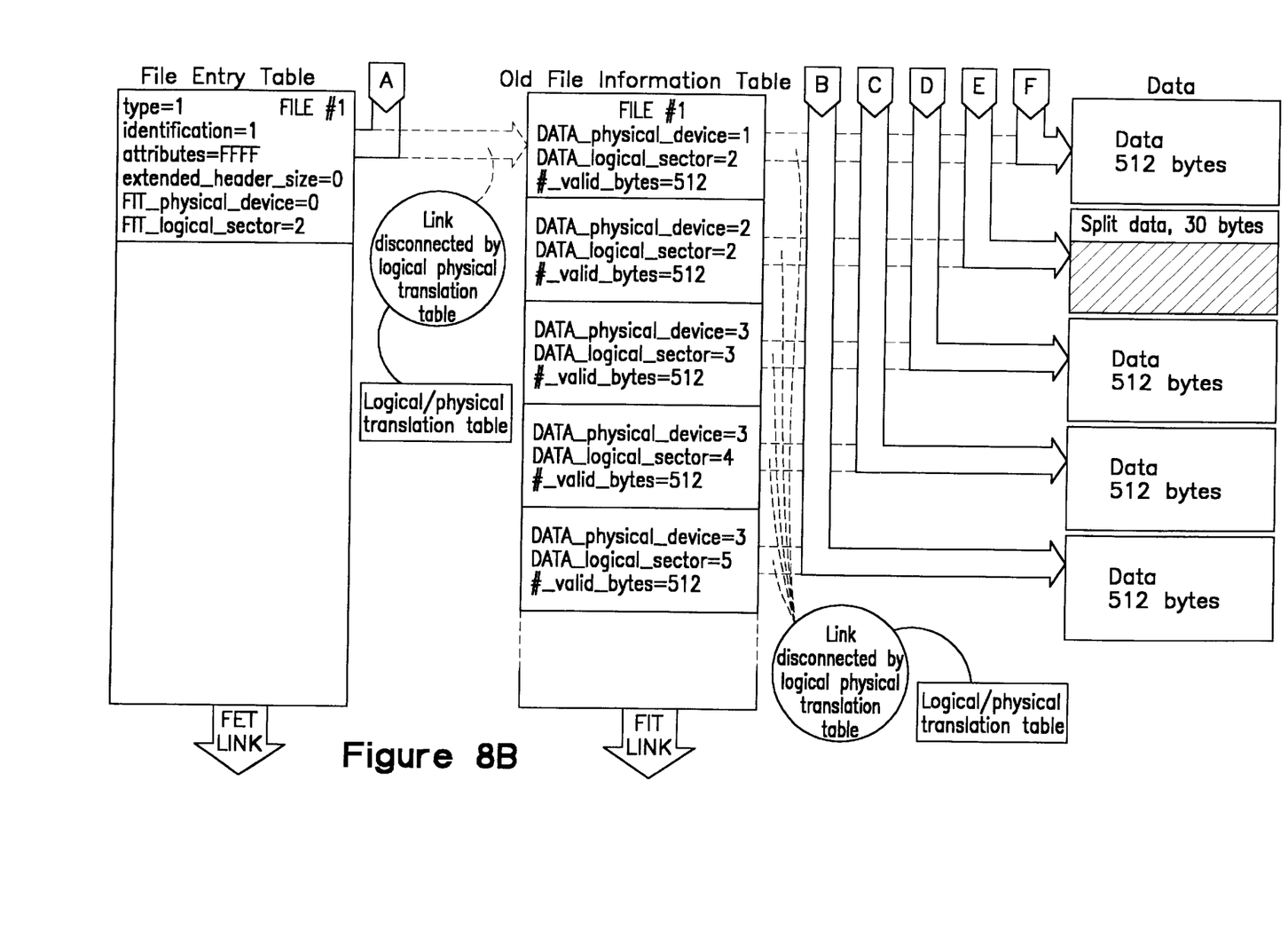

If rather than starting at a condition such as is illustrated in FIG. 5 in which there are only two file information entries, additional file information entries exist following the entry pointing to data at which an insertion is to be made, the same process would be followed. However, in order to accomplish this, all of the original file information entries following the point of the insertion are invalidated by rewriting the file information table beginning at the FIE sector which includes the file information entries pointing to changed data so that these entries are inserted at the proper place in the chain. The file entry in the file entry table need not be changed since it points to a logical sector identifier. The file manager logical-to-physical translation table provides the new physical address for the logical sector. All of the file information entries (even though rewritten) except the second, third, and fourth remain the same and point to the same data stored in the same data sectors. The only data that need be rewritten is the data pointed to by the third and fourth file information entries. This insertion is illustrated in FIG. 8 Thus, to insert data requires only that the file information table be modified or rewritten, but only from the point of the insert, and that the data files related to the insertion be rewritten. The data files not affected by the insertion remain in position without change. This requires, at most, the rewriting of the file information table and two sectors of data. Such an operation requires much less power than does the typical rewriting of the file allocation table and all data of the data files from the point of the insertion on as is required by prior art systems.

Figure 7:
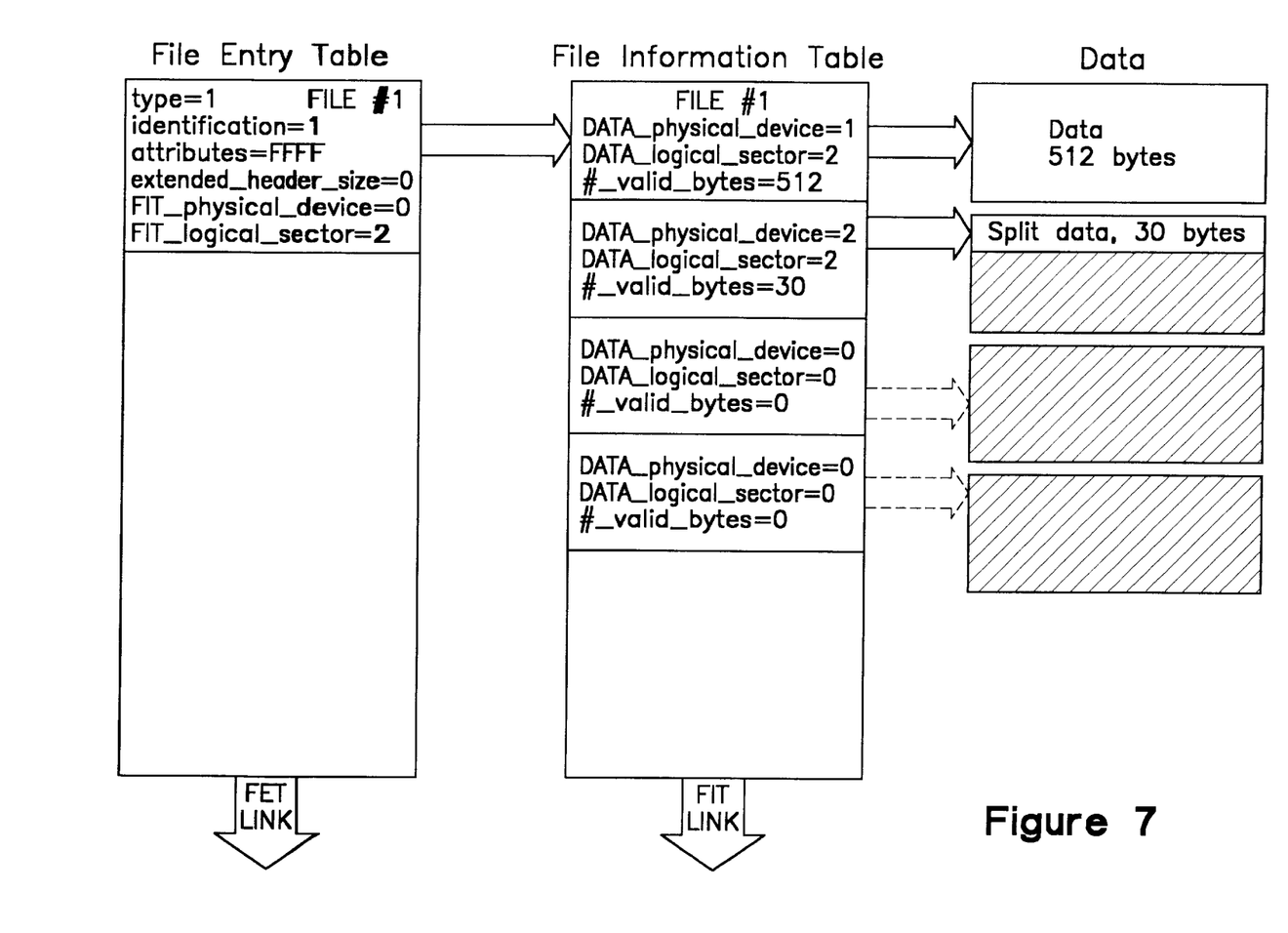
FIG. 7 is a diagram illustrating the arrangement of the various data structures and data in the flash array when the data arrangement described in FIG. 6 is modified by deleting data within a file.

FIG. 7 is a diagram illustrating the arrangement of the various data structures and data in the flash array when the data arrangement described in FIG. 6 is modified by deleting all bytes of data in the file following the first thirty bytes of data described by the second file information entry. All that is required is that the third and fourth file information entries have zeroes written to their entries. This can be accomplished by writing to the space presently occupied by the third, fourth, and fifth file information entries since the bits at which the changes are to be made are known and may be programmed to zeroes. If less than thirty bytes were to be left in the data sector pointed to by the third file information entry, then the third file information entry would be rewritten with the new number of remaining valid bytes.

Thus, this particular deletion of data requires only a simple writing of sixteen bytes in order to zero out the entries in the fourth and fifth file information entries, an operation which requires much less power compared to the rewriting typically required by prior art systems.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A method for organizing data in a flash memory array, said method comprising the steps of:

storing data in the flash memory array in a plurality of files, each of the plurality of files being respectively stored in one or more sectors having a predetermined size;

storing in the flash memory array a plurality of file information tables, each of the plurality of file information tables corresponding to a respective file of the plurality of files; and storing in each of the plurality of file information tables one or more file information entries, there being one respective file information entry for each of the one or more sectors in the respective file, each of the one or more file information entries including a pointer to a respective sector of the one or more sectors and a value indicating a number of storage locations in the respective sector that contain valid data.

2. The method of claim 1 further comprising the step of storing in the flash memory array a file entry table including a plurality of file entries respectively corresponding to the plurality of files, each of the plurality of file entries including a pointer to a respective one of the plurality of file information tables.

3. The method of claim 1 wherein said step of storing a plurality of file information tables includes the step of storing each of the one or more file information entries starting at respective addresses equally offset from one another to enable each of the one or more file information entries to be located without reference to a value stored in another of the one or more file information entries.

4. A method for inserting data in a file stored in a flash memory array, the method comprising the steps of:

identifying a first unit of storage that includes a predetermined number of storage locations in the flash memory array and having stored therein at least a portion of a file, the at least a portion of the file including a first number of data values and a separate second number of data values between which additional data is to be inserted;

storing in a second unit of storage that includes the predetermined number of storage locations in the flash memory array at least a portion of the additional data; and storing in a file organization table in the flash memory array an entry including a pointer to the first unit of storage and a value indicating that the first unit of storage contains the first number of valid data values.

5. The method of claim 4 further comprising the step of storing in the second unit of storage at least a portion of the second number of data values from the first unit of storage.

6. The method of claim 5 further comprising the step of storing in the file organization table an entry including a pointer to the second unit of storage and a value indicating that the second unit of storage contains a number of valid data values equal to a sum of the at least a portion of the additional data and the at least a portion of the second number of data values.

7. A method comprising:

identifying in a flash memory array a first storage division having stored therein first and second portions of a file;

allocating a second storage division in the flash memory array;

storing in the second storage division data to be inserted in the file between the first and second portions; and storing a value that indicates the amount of valid data stored in the first storage division to indicate that the first storage division contains the amount of data in the first portion of the file.

8. The method of claim 7 further comprising the steps of:

storing in the second storage division at least part of the second portion of the file if there are remaining storage locations in the second storage division after storing the data to be inserted in the file;

allocating a third storage division in the flash memory array; and storing in the third storage division any part of the second portion of the file not stored in the second storage division.

9. The method of claim 7 wherein said step of identifying a first storage division includes the step of identifying the first storage division based on a file organization data structure stored in the flash memory array.

10. The method of claim 7 further comprising the step of storing in a file organization data structure an entry including a pointer to the first storage division and the value indicating the amount of data stored in the first storage division.

11. The method of claim 7 further comprising the step of storing in the second storage division at least part of the second portion of the file if there are remaining storage locations in the second storage division after storing the data to be inserted in the file.

12. The method of claim 7 wherein the first storage division and the second storage division each include an equal and predetermined number of storage locations.

13. The method of claim 7 wherein each of the first and second storage divisions is a sector having a predetermined size.

14. An apparatus including:

a processor;

a flash memory array; and a memory having stored therein software which, when executed by the processor, causes the processor to:
identify in the flash memory array a first storage division having stored therein first and second portions of a file;
allocate a second storage division in the flash memory array;
store in the second storage division data to be inserted in the file between the first and second portions; and
store a value that indicates the amount of valid data stored in the first storage division to indicate that the first storage division contains the amount of data in the first portion of the file.

15. The apparatus of claim 14 wherein the software, when executed by the processor, further causes the processor to store in a file organization data structure in the flash memory array an entry including a pointer to the first storage division and a value indicating the number of valid data values stored in the first storage division.

16. The apparatus of claim 14 wherein the software, when executed by the processor, further causes the processor to store in the second storage division at least part of the second portion of the file if there are remaining storage locations in the second storage division after storing the data to be inserted in the file.

17. The apparatus of claim 14 wherein the first storage division and the second storage division each include an equal and predetermined number of storage locations.

18. The apparatus of claim 14 wherein each of the first and second storage divisions is a sector having a predetermined size.

19. An apparatus comprising:

means for storing data in the flash memory array in a plurality of files, each of the plurality of files being respectively stored in one or more sectors having a predetermined size;

means for storing in the flash memory array a plurality of file information tables, each of the plurality of file information tables corresponding to a respective file of the plurality of files; and means for storing in each of the plurality of file information tables one or more file information entries, there being one respective file information entry for each of the one or more sectors in the respective file, each of the one or more file information entries including a pointer to a respective sector of the one or more sectors and a value indicating a number of storage locations in the respective sector that contain valid data.

20. An apparatus comprising:

a programmed processor storing data in the flash memory array in a plurality of files, each of the plurality of files being respectively stored in one or more sectors having a predetermined size;

said programmed processor storing in the flash memory array a plurality of file information tables, each of the plurality of file information tables corresponding to a respective file of the plurality of files; and said programmed processor storing in each of the plurality of file information tables one or more file information entries, there being one respective file information entry for each of the one or more sectors in the respective file, each of the one or more file information entries including a pointer to a respective sector of the one or more sectors and a value indicating a number of storage locations in the respective sector that contain valid data.

21. An article of manufacture including one or more computer-readable media having embodied thereon instructions which, when executed by a processor, cause said processor to perform the steps of:

identifying in a flash memory array a first storage division having stored therein first and second portions of a file;

allocating a second storage block in the flash memory array;

storing in the second storage division data to be inserted in the file between the first and second portions; and storing a value that indicates the amount of valid data stored in the first storage division to indicate that the first storage division contains the amount of data in the first portion of the file.

22. The article of claim 21 wherein the instructions, when executed by the processor, further cause the processor to store in the second storage division at least part of the second portion of the file if there are remaining storage locations in the second storage division after storing the data to be inserted in the file.

23. The article of claim 22 wherein the instructions, when executed by the processor, further cause the processor to:

allocate a third storage division in the flash memory array; and store in the third storage division any part of the second portion of the file not stored in the second storage division.

24. The article of claim 21 wherein the first storage division and the second storage division each include an equal and predetermined number of storage locations.

25. The article of claim 21 wherein said step of identifying a first storage division includes the step of identifying the first storage division based on a file organization data structure stored in the flash memory array.

26. The article of claim 21 wherein each of the first and second storage divisions is a sector having a predetermined size.

* * * * *